United States Patent
Liu

(12) 
(10) Patent No.: US 6,450,249 B1
(45) Date of Patent: Sep. 17, 2002

(54) HEAT SINK FASTENING DEVICE

(76) Inventor: Hung Tsi Liu, No. 29, Alley 3, Lane 240, Chung Hsing Rd., Long Tan Hsiang, Tao Yuan Hsien (TW)

( * ) Notice: Subject to any disclaimer, the term of this patent is extended or adjusted under 35 U.S.C. 154(b) by 0 days.

(21) Appl. No.: 10/103,292

(22) Filed: Mar. 22, 2002

(51) Int. Cl.⁷ .................................................. F28F 7/00
(52) U.S. Cl. ...................... 165/80.3; 165/185; 165/76; 361/704; 257/718; 257/719
(58) Field of Search .............................. 165/185, 80.3, 165/67, 68, 76; 361/700, 704; 257/718, 719, 722

(56) References Cited

U.S. PATENT DOCUMENTS

| | | | | |
|---|---|---|---|---|
| 5,430,610 A | * | 7/1995 | Hung | 165/80.3 |
| 5,771,155 A | * | 6/1998 | Cook | 257/719 |
| 6,049,457 A | * | 4/2000 | Lee | 257/719 |
| 6,266,245 B1 | * | 7/2001 | Wei | 257/719 |
| 6,344,971 B1 | * | 2/2002 | Ju | 361/704 |
| 6,362,962 B1 | * | 3/2002 | Lee et al. | 165/80.3 |

* cited by examiner

*Primary Examiner*—Christopher Atkinson
(74) *Attorney, Agent, or Firm*—Bacon & Thomas, PLLC

(57) ABSTRACT

A heat sink fastening device is constructed to include two clamping plates each having two triangular clamping arms adapted for clamping on a holder to hold down a heat sink on the holder, and two hook wires respectively mounted in respective retaining notches in the triangular clamping arms of the clamping plates to hold down the clamping plates, each hook wire having two smoothly arched supporting portions at the ends and two hooking tips respectively horizontally extended from the smoothly arched supporting portions and respectively hooked in respective through holes in the triangular clamping arms of the clamping plates.

3 Claims, 5 Drawing Sheets

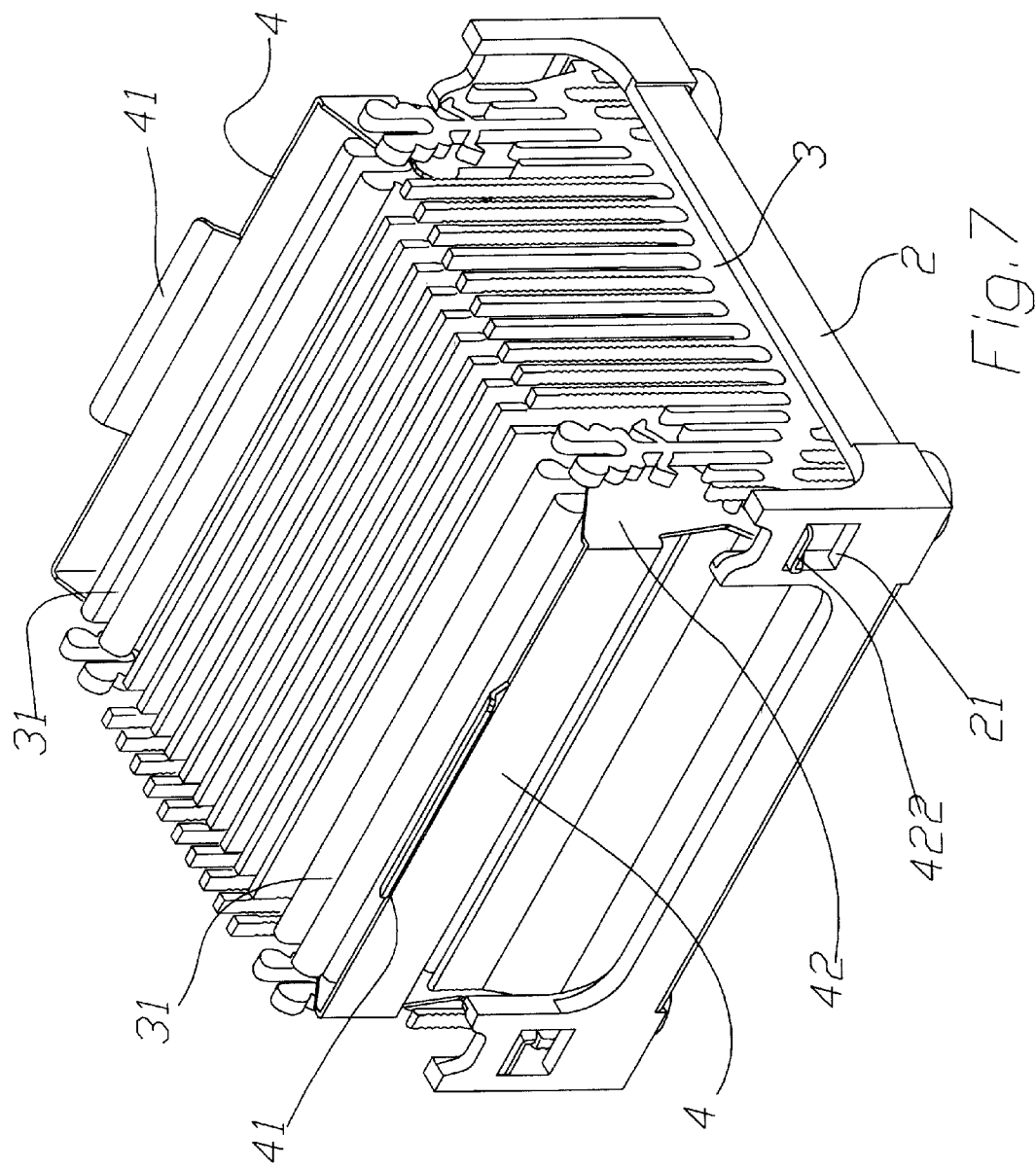

HEAT SINK FASTENING DEVICE

BACKGROUND OF THE INVENTION

1. Field of the Invention

The present invention relates to fastening devices for use to fasten a heat sink to a CPU holder and, more particularly, to a heat sink fastening device, which can easily detachably be installed to hold down a heat sink on a holder firmly.

2. Description of the Related Art

Heat sinks are commonly used for dissipating heat from a semiconductor device, for example, a CPU. FIG. 1 illustrates a conventional heat sink fastening device fastened to a CPU holder to hold down a heat sink. This structure of heat sink fastening device comprises two clamping plates. Each clamping plate comprises an angled clamping arm 11 and a vertical clamping arm 12 coupled to one end of the angled clamping arm 11. The clamping arms 11 and 12 each have a respective opposite end terminating in a respective hooked portion 111 or 121 for hooking on a respective hook hole 21 in the CPU holder 2. This structure of heat sink fastening device is still not satisfactory in function because the hooked portions 111 and 121 of the clamping arms 11 and 12 tend to be forced away from the respective hook holes 21 upon a vibration.

SUMMARY OF THE INVENTION

The present invention has been accomplished to provide a heat sink fastening device, which eliminates the aforesaid problem. According to one aspect of the present invention, the two clamping plates each having two triangular clamping arms adapted for clamping on a holder to hold down a heat sink on the holder, and two hook wires respectively mounted in respective retaining notches in the triangular clamping arms of the clamping plates to hold down the clamping plates, each hook wire having two smoothly arched supporting portions at the ends and two hooking tips respectively horizontally extended from the smoothly arched supporting portions and respectively hooked in respective through holes in the triangular clamping arms of the clamping plates. According to another aspect of the present invention, the clamping plates each have a finger strip for pressing by hand to disengage the hooked portions of the clamping arms from the respective hook holes of the holder.

BRIEF DESCRIPTION OF THE DRAWINGS

FIG. 7 is a perspective view of the present invention showing the hook wires fastened to the clamping plates, the clamping plates mounted on the heat sink and clamped on the holder.

DETAILED DESCRIPTION OF THE PREFERRED EMBODIMENT

Figure 1:
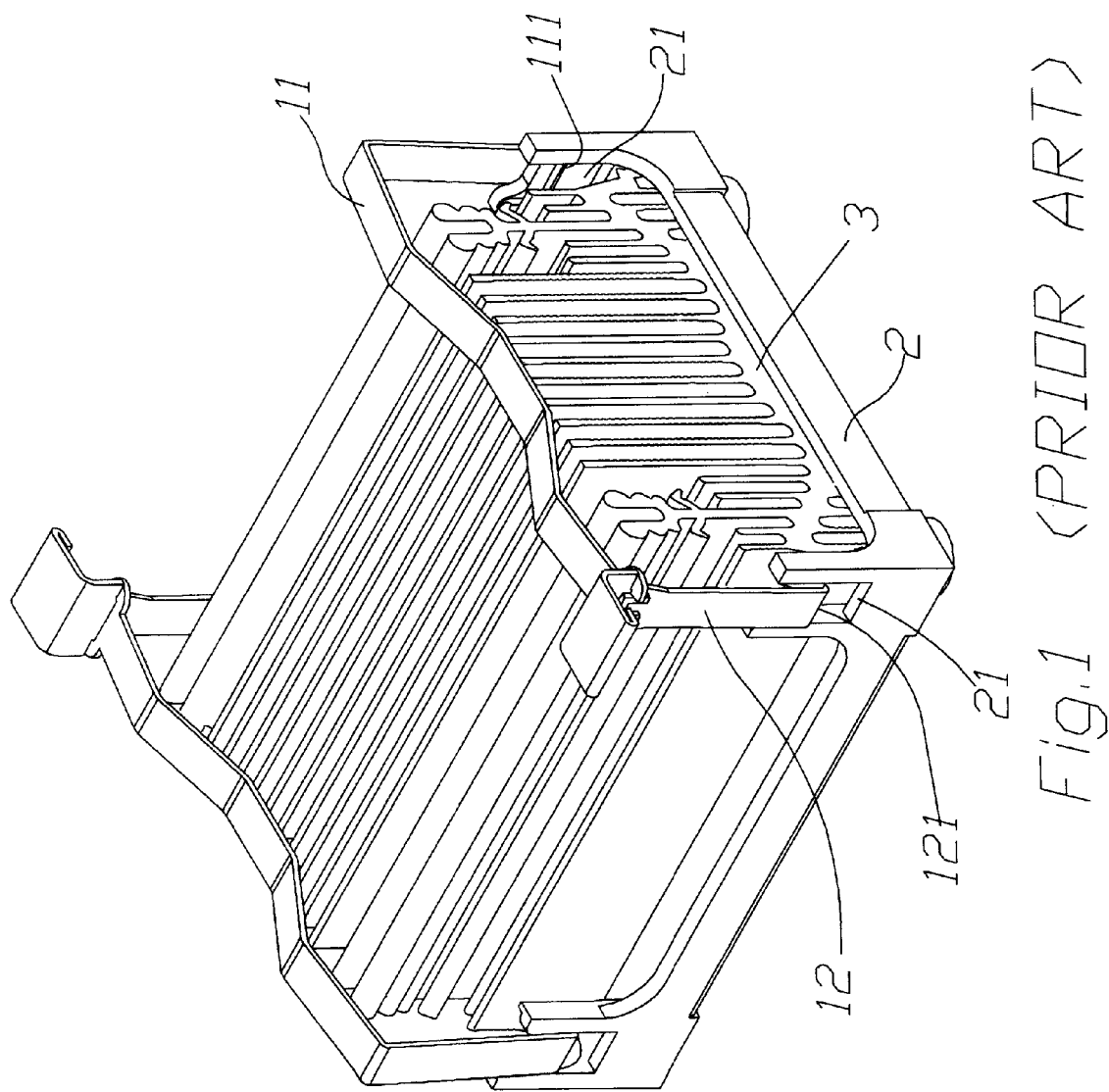
FIG. 1 is a perspective view showing the application of heat sink fastening device according to the prior art.
Figure 2:
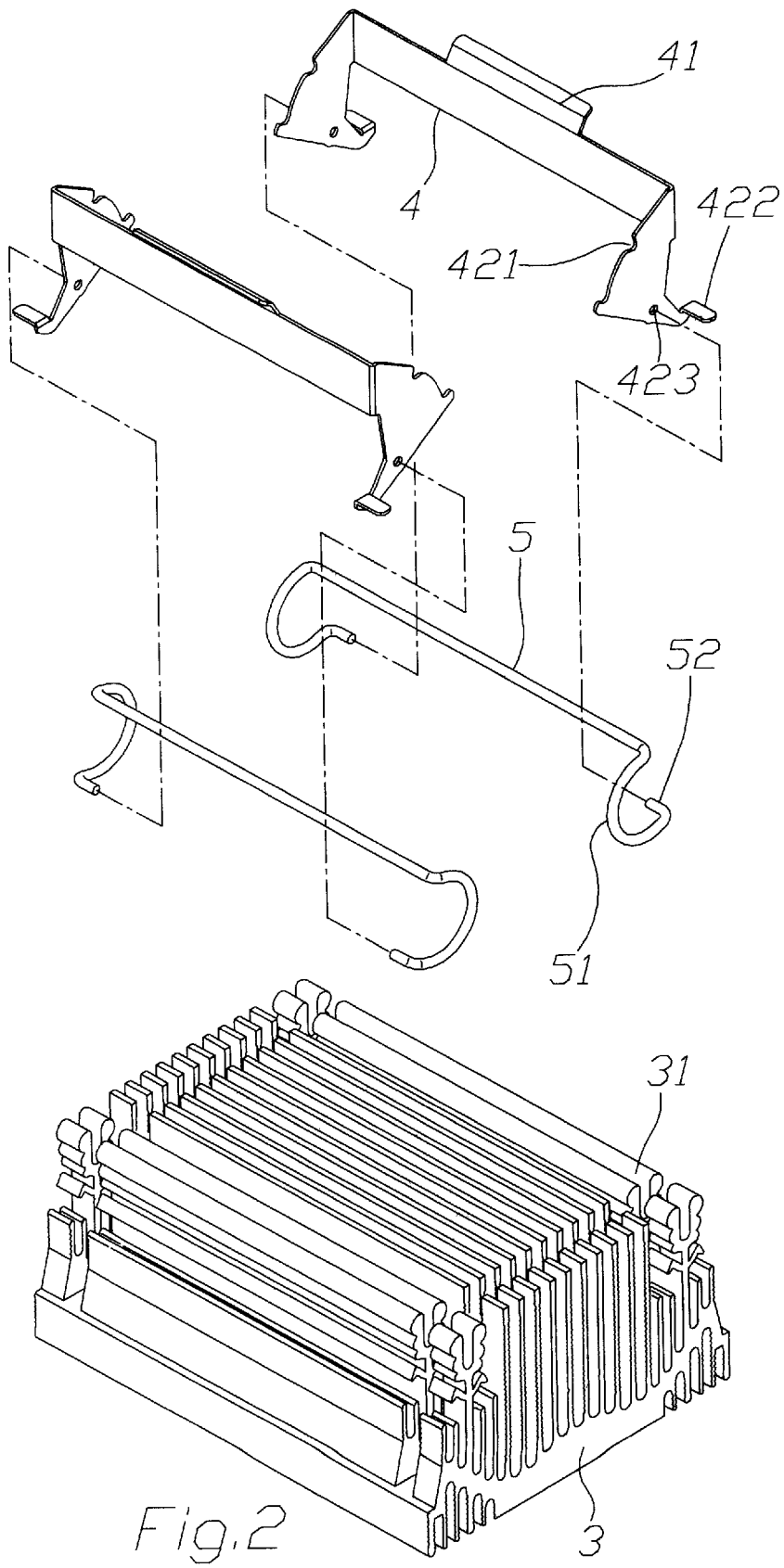
FIG. 2 is an exploded view of a heat sink fastening device according to the present invention.
Figure 4:
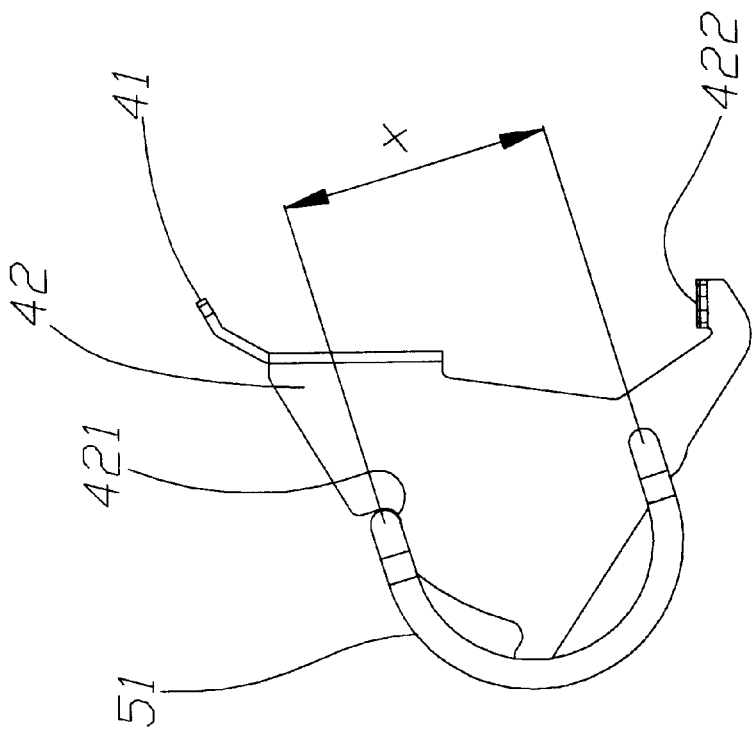
FIG. 4 shows the arrangement of the clamping plate and the corresponding hook wire after insertion of the hooking tips of the hook wire into the through holes of the corresponding clamping plate.
Figure 3:
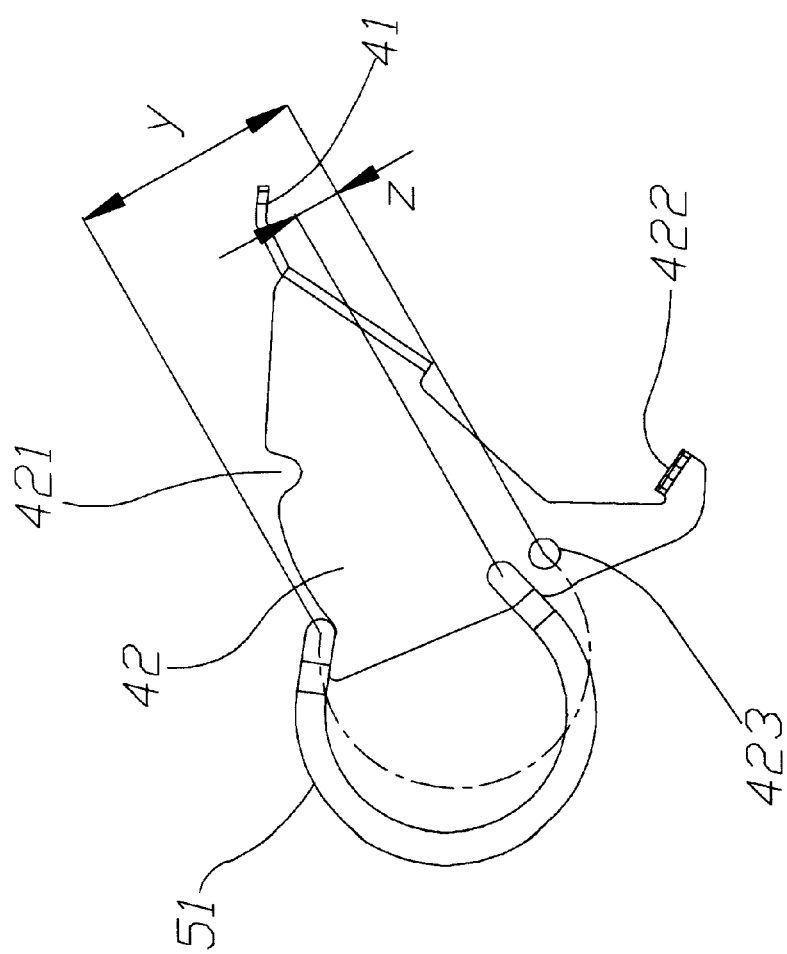
FIG. 3 shows the arrangement of the clamping plate and the corresponding hook wire before insertion of the hooking tips of the hook wire into the through holes of the corresponding clamping plate.

Referring to FIGS. From 2 through 4, a heat sink fastening device in accordance with the present invention is generally comprised of two clamping plates 4 and two hook wires 5.

Each clamping plate 4 comprises a finger strip 41 upwardly protruded from the middle part, and two flat triangular clamping arms 42 respectively perpendicularly extended from the two distal ends. The flat triangular clamping arms 42 each comprise a retaining notch 421 disposed at one side, a hooked portion 422 horizontally extended from the bottom end, and a through hole 423 disposed adjacent to the hooked portion 422.

The hook wires 5 are elongated wire rod members each having two smoothly arched supporting portions 51 respectively extended from the two distal ends and arranged in parallel, and two hooking tips 52 respectively horizontally extended from the smoothly arched supporting portions 51 toward each other. The distance Z between the ends of each smoothly arched supporting portion 51 is shorter than the distance Y between the retaining notch 421 and through hole 423 of each flat triangular clamping arm 42. After mounting of the hook wires 5 in the retaining notches 421 of the clamping plates 4 and insertion of the hooking tips 52 into the through holes 423 of the clamping plates 4 respectively, the ends of each smoothly arched supporting portion 51 are expanded from the original distance Z to a relatively greater distance X, imparting an inward pressure to the clamping plates 4.

Figure 5:
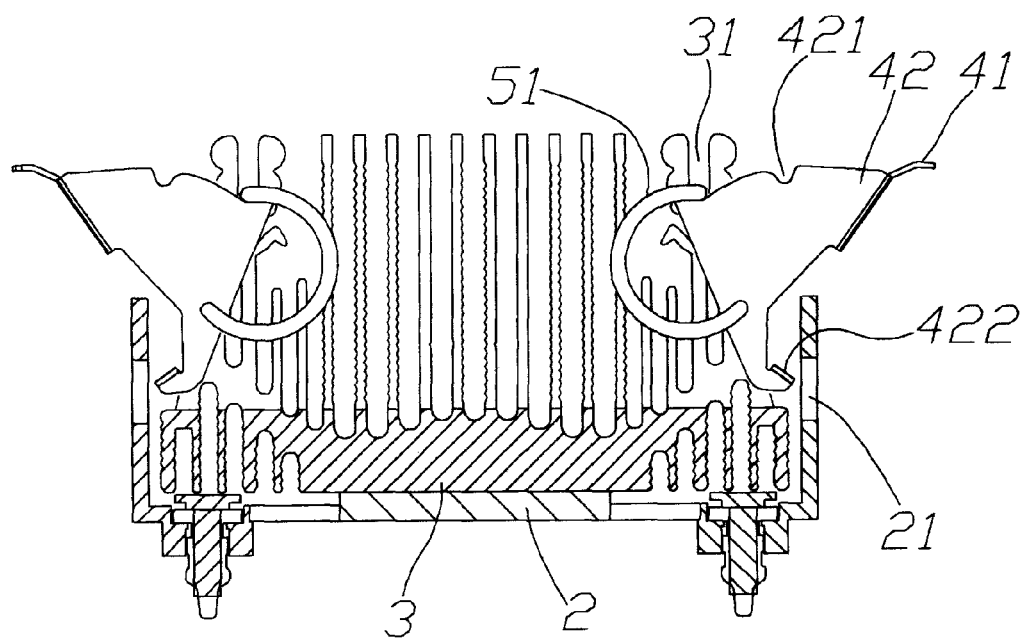
FIG. 5 is an installed view of the present invention (I).
Figure 6:
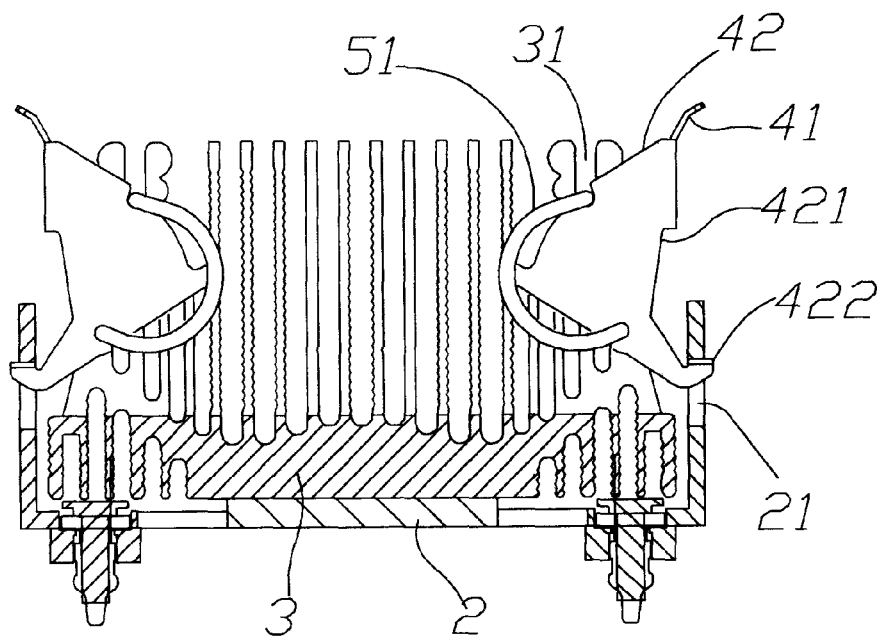
FIG. 6 is an installed view of the present invention (II).

Referring to FIGS. 5 and 6, after mounting of the hook wires 5 in retaining notches 421 of the flat triangular clamping arms 42 of the clamping plates 4, the hook wires 5 are put in respective mounting grooves 31 of the heat sink 3, and then the hooking tips 52 of the hook wires 5 are respectively into the through holes 423 of the flat triangular clamping arms 42 of the clamping plates 4, thereby causing the hooked portions 422 of the clamping plates 4 to be hooked in respective hook holes 21 of the holder 2 to secure the heat sink 3 to the holder 2 firmly. When dismounting the heat sink 3, press the finger strips 41 of the clamping plates 4 outwards to disengage the hooked portions 422 from the respective hook holes 21 of the holder 2, for enabling the heat sink 3 to be removed from the holder 2.

Referring to FIG. 7, after installation, the hooked portions 422 of the clamping plates 4 are firmly retained hooked in the respective hook holes 21 of the holder 2 to hold down the heat sink 3 on the holder 2, preventing vibration.

While only one embodiment of the present invention has been shown and described, it will be understood that various modifications and changes could be made thereunto without departing from the spirit and scope of the invention disclosed.

What the invention claimed is:

1. A heat sink fastening device adapted for fastening a head sink to a holder, comprising:

two clamping plates adapted for clamping on the holder to hold down the heat sink on the holder, said clamping plates each comprising two flat triangular clamping arms respectively perpendicularly extended from two distal ends thereof, said flat triangular clamping arms each comprising a retaining notch disposed at one side, a hooked portion horizontally extended from a bottom end thereof and adapted for hooking in a respective hook hole of the holder, and a through hole disposed adjacent to said hooked portion; and two hook wires respectively fastened to the retaining notches of said clamping plates to hold down said clamping plates, said hook wires each comprising two smoothly arched supporting portions respectively extended from two distal ends thereof and arranged in parallel, and two hooking tips respectively horizontally extended from said smoothly arched supporting portions and adapted for hooking in the through holes of said clamping plates.

2. The heat sink fastening device as claimed in claim 1, wherein said clamping plates each further comprise a finger strip upwardly protruded from a middle part thereof for pressing by hand to force the hooked portions of said hook wires from the respective hook holes of the holder.

3. The heat sink fastening device as claimed in claim 1, wherein the distance between the ends of each of said smoothly arched supporting portions is shorter than the distance between the retaining notch and through hole of each of said flat triangular clamping arms of said clamping plates.

* * * * *